United States Patent [19]

Strifler et al.

[11] Patent Number: 5,652,179

[45] Date of Patent: Jul. 29, 1997

[54] METHOD OF FABRICATING SUB-MICRON GATE ELECTRODE BY ANGLE AND DIRECT EVAPORATION

[75] Inventors: Walter Andrew Strifler, Sunnyvale; Carol Yu-Bin Lee, Cupertino; William Robert Hitchens, Mountain View; Ronald David Remba, Sunnyvale, all of Calif.

[73] Assignee: Watkins-Johnson Company, Palo Alto, Calif.

[21] Appl. No.: 638,950

[22] Filed: Apr. 24, 1996

[51] Int. Cl.$^6$ ................................................ H01L 21/8252
[52] U.S. Cl. ............................ 437/184; 437/80; 437/176
[58] Field of Search ....................... 437/39, 405 H, 437/415 H, 175, 176, 184, 80; 148/DIG. 140, DIG. 143

[56] References Cited

U.S. PATENT DOCUMENTS

| | | | |
|---|---|---|---|
| 4,536,942 | 8/1985 | Chao et al. | 437/176 |
| 4,551,905 | 11/1985 | Chao et al. | 437/176 |
| 4,774,200 | 9/1988 | Nakajima et al. | 437/39 |
| 4,935,377 | 6/1990 | Strifler et al. | 437/176 |
| 5,254,492 | 10/1993 | Tserng et al. | 437/184 |
| 5,374,328 | 12/1994 | Remba et al. | 156/628.1 |

FOREIGN PATENT DOCUMENTS 86104718.1-A1  11/1986  European Pat. Off. .

OTHER PUBLICATIONS

Donald K. Atwood. "Vacuum Passivated T-Gates: A New Method for Fabricating Submicron Gates," SPIE vol. 1263 Electron-Beam, X-Ray, and Ion-Beam Technology: Submicrometer Lithographies IX (1990), pp. 209:216.

C.L. Cheng, et al. "Submicrometer Self-Aligned Recessed Gate InGaAs MISFET Exhibiting Very High Transconductance," IEEE Electron Device Letters, vol. EDL-5, No. 5, May 1984, pp. 169:171.

William R. Frensley, et al., "Design and Fabrication of a GaAs Vertical MESFET," IEEE Transactions on Electron Devices, vol. ED-32, No. 5, May 1985, pp. 952:956.

Y. Imai, et al. "A Sub-Half-Micron Gate-Length GaAs MESFET with New Gate Structure," IEEE Electron Device Letters, vol. EDL-4, No. 4, Apr. 1983, pp. 99:101.

Youngwoo Kwon, et al. "Experimental and Theoretical Characteristics of High Performance Pseudomorphi Double Heterojunction InAlAs/In$_{0.7}$Ga$_{0.3}$As/InAlAs HEMT's," IEEE Transactions on Electron Devices, vol. 42, No. 6, Jun. 1995, pp. 1017:1025.

Susumu Takahashi, et al. "Reproducible Submicron Gate Fabrication of GaAs FET by Plasma Etching," IEEE IEDM, Washington, 1976, pp. 214:217.

M.A. Thompson et al. "High Aspect Ratio Asymmetric Gate Structures Employed in Novel Self-Aligned High Electron Mobility Transistor Technology," *J. Vac. Sci. Technol. B* *(6), Nov./Dec. 1990, pp. 1339:1342.

*Primary Examiner*—Chandra Chaudhari
*Attorney, Agent, or Firm*—Flehr Hohbach Test Albritton & Herbert, LLP.

[57] ABSTRACT

Disclosed is a method of fabricating semiconductor devices having sub-micron gate electrodes using angle and direct evaporation techniques. A first and second photoresist layer are formed atop a substrate and the second layer is selectively processed to form an edge with a well controlled profile. A first metal is evaporated at a first angle and the edge of the second photoresist layer shields a portion of the first photoresist layer form metal deposition which defines a patterned opening of desired width. The patterned opening is now etched in a well controlled manner to expose a portion of the active channel region of the device, and a desired height is defined by the distance from the first metal layer to the exposed channel region. A second layer is deposited by evaporation at a second angle thereby forming a plug in the channel region wherein placement of one edge of the plug is determined by the height and the second angle. A gate metal is now directly deposited atop the semiconductor to form a gate electrode in the active channel region, said electrode having a gate length defined by the distance between the edge of the plug and one side of the first metal patterned opening.

23 Claims, 8 Drawing Sheets

Typical Physical and Electrical Characteristics of
GaAs Metal-Semiconductor Field-Effect-Transistor Wafer
with Sub-Quarter Micron Gamma Gates
200um wide Pi-FET with 4 gate feeds

| Bias | Parameter | units | Mean | Standard Deviation |
|---|---|---|---|---|
| – | Lgs | μm | 0.13 | 0.0% |
| – | Lg | μm | 0.23 | 3.2% |
| – | Lgd | μm | 0.41 | 2.7% |
| – | Rg | ohms/100 μm | 30 | 5.1% |
| Vds = 3.0V Ids = 1/2 x Idss | NF @ 12 GHz | dB | 1.0 | 0.0% |
| | Gass @ 12 GHz | dB | 16 | 0.9% |
| Vds = 3.0V Ids = 1/4 x Idss | NF @ 12 GHz | dB | 0.95 | 3.8% |
| | Gass @ 12 GHz | dB | 14 | 1.5% |

FIG. 5A

Definition of FET related terms

| Lgs | gate-source electrode spacing |
|---|---|
| Lg | gate length |
| Lgd | gate-drain electrode spacing |
| Rg | gate resistance per gate width |
| Vds | drain-to-source electrode bias |
| Ids | drain-to-source current |
| Idss | saturated drain-to-source current |
| NF | frequency-dependent noise figure |
| Gass | frequency-dependent gain measured when FET is matched for minimum noise |

METHOD OF FABRICATING SUB-MICRON GATE ELECTRODE BY ANGLE AND DIRECT EVAPORATION

This invention relates generally to fabrication of semiconductor devices, and more particularly to a method of fabricating high frequency or wide microwave bandwidth Group III–V compound semiconductor devices having a sub micron gate electrodes using angle and direct metal evaporation.

BACKGROUND OF THE INVENTION

High frequency and wide microwave bandwidth field effect transistors (FETs) are useful for many applications, such as, high performance commercial communications and military systems and automotive collision avoidance systems. The maximum operating frequency of a FET is dependent upon the length of the gate electrode positioned between the source and drain regions of the FET. For example, gate capacitance can be lowered by shortening the gate length which increases the maximum operating frequency. However this reduces the cross sectional area of the gate which causes gate resistance to rise. High gate resistance leads to degradation of the microwave noise figure and degradation of gain at microwave frequencies. Thus it is advantageous to fabricate a gate with a short gate length without significant reduction in the overall cross-sectional area of the gate.

A gamma gate (often referred to as a "mushroom gate") is a gate electrode often used in FET devices which has a cross section shaped like the Greek letter gamma (Γ). The gamma gate has been found to be desirable because the gate length at the interface with the wafer surface is very short while a desirable cross-sectional area is maintained with the larger cap.

Reliable and affordable fabrication of such gate electrodes has proven difficult particularly when reducing gate lengths to sub-quarter micron dimensions. Many prior art methods employ expensive or low yield techniques such as electron beam (e-beam) lithography, photoresist reflow or optical steppers using phase-shift mask techniques. These methods suffer from poor cost effectiveness (electron beam), low throughput (electron beam), and poor uniformity and repeatability (photoresist reflow) and process immaturity (phase-shift mask).

SUMMARY AND OBJECTS OF THE INVENTION

Accordingly it is an object of the present invention to provide an improved method of fabricating a semiconductor device having a sub-micron gate electrode.

A related object of the invention is to provide a method of fabricating a Group III–V compound FET with a sub-micron gate electrode that is uniform over the entire wafer surface.

A further object of the present invention is to provide a method suitable to fabricate a sub-micron gate electrode of the type described as a gamma (or mushroom) gate electrode by using angle evaporation techniques.

Yet another object of this invention is to provide a method that provides reproducible sub-micron gate electrodes in a cost effective manner that can employ visible light for pattern definition.

These and other objects are achieved by the invention disclosed herein, generally comprising the steps of: providing a gallium arsenide (GaAs) wafer having a GaAs substrate and drain and source regions formed therein and a GaAs active channel region. A first and second photoresist layer are then formed atop the GaAs substrate. The second photoresist layer is selectively processed to form an edge with a well controlled profile thereby exposing a portion of the first photoresist layer. Thereafter a first metal layer is deposited by evaporation atop the first and second photoresist layers at an angle with respect to the wafer normal. The edge of the second photoresist layer shields a portion of the first photoresist layer from metal deposition which defines a patterned opening of width "w". Next, the masked photoresist on the wafer is etched, exposing a portion of the underlying GaAs substrate. The GaAs wafer is now etched in a well controlled manner that is substantially uniform across the wafer. This exposes the active channel region, and a height "h" is defined by the distance from the first metal layer atop the second photoresist layer to the bottom of the etched active channel region. A second layer is deposited by evaporation atop the wafer at a second angle with respect to the wafer. This forms a plug in said channel region wherein the placement of one edge of the plug is determined by the height "h" and the second angle. A gate metal is now directly deposited atop the wafer at an angle perpendicular to the wafer to form a gate electrode in the channel region, the gate electrode having a gate length defined by the distance between the edge of the plug and one side of the first metal mask, and a cap of width "w". Thereafter, the second evaporated layer is selectively removed. Lastly, the first metal layer, and the first and second photoresist layers are removed leaving the gate electrode intact.

In a second embodiment of the invention an etch stop layer is used to terminate the etch of the GaAs wafer. Accordingly, in this embodiment the wafer comprises a GaAs substrate with drain and source regions formed therein, an etch stop layer, and a GaAs active channel region underlying the etch stop layer. The wafer is processed according to the steps above except that the etch of the GaAs Wafer terminates upon reaching the etch stop layer.

In a third embodiment of the invention, after removal of the first and second photoresist layers and the first metal layer, at least one passivating layer of dielectric material is deposited in a conformal layer to protect the wafer.

BRIEF DESCRIPTION OF THE DRAWINGS

Other objects and advantages of the invention become apparent upon reading of the detailed description of the invention and the appended claims provided below, with references to the drawings in which:

FIGS. 5c and 5d illustrate an elevated view and a cross sectional view, respectively, of a completed FET showing certain of the parameters of FIG. 5a.

DETAILED DESCRIPTION OF THE INVENTION

Figure 1:
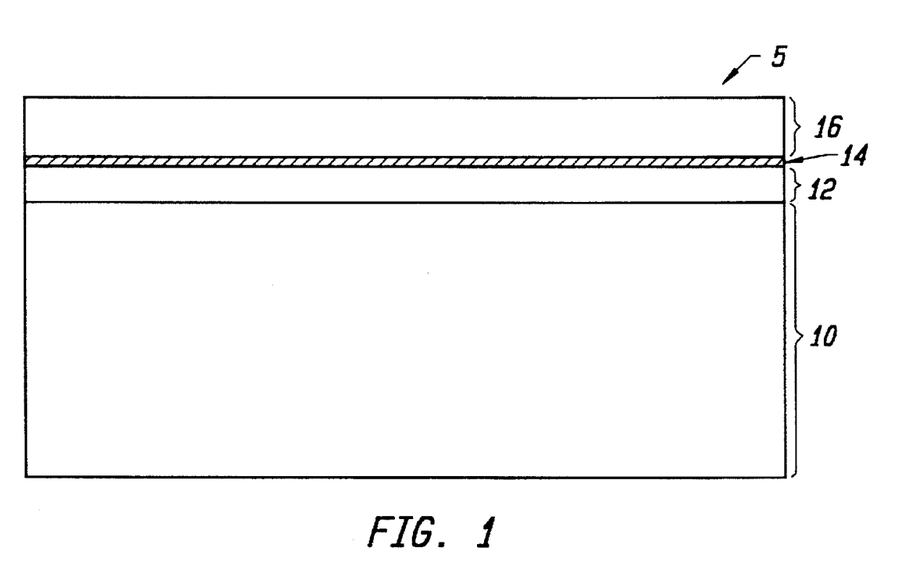
FIG. 1 generally shows a cross-sectional view (not to scale) of a semiconductor wafer which may be further processed to yield a GaAs based FET in accordance with one embodiment of the present invention.

As will be appreciated by the detailed description below, the present invention provides a method capable of providing reproducible and uniform gate electrodes having sub-quarter micron gate lengths. Although the compound semiconductor material discussed herein is comprised of GaAs and specific examples are provided, it is intended that the method of the invention may be practiced with other semiconductor compounds. Moreover it should be apparent to one skilled in the art that other device structures may be employed depending upon the type of device to be fabricated. Referring now to the drawings, wherein like components are designated by like reference numerals, FIG. 1 illustrates a cross sectional view of a semiconductor wafer 5 which may be further processed to yield, for example, a GaAs FET. Wafer 5 generally includes a GaAs substrate 10 with an active layer 12 formed atop the surface of the substrate 10. Preferably, an etch stop layer 14 of specific composition and thickness is formed on the active layer 12 and serves to terminate the selective etching process. Atop the etch stop layer 14 is formed a doped layer 16 and upon later formation of source and drain electrodes (not shown) will define a source region 16a and a drain region 16b therein. In an alternative embodiment of the invention, the etch stop layer 14 is omitted.

Figure 2A:
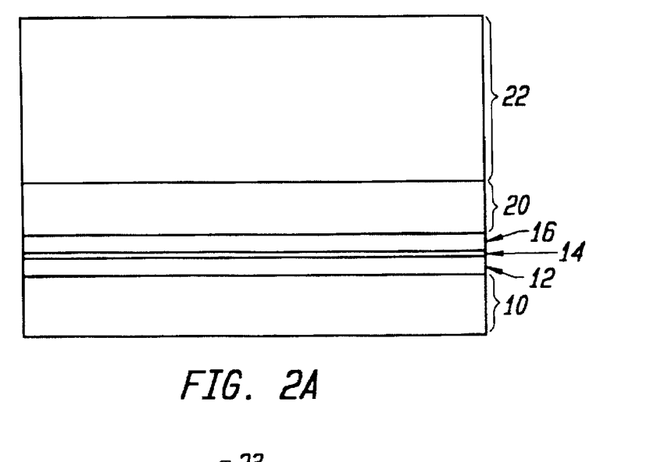
FIGS. 2A–2H are cross-sectional views of a portion of the GaAs wafer of FIG. 1 showing the steps to fabricate a gate electrode in accordance with one embodiment of the present invention.
Figure 2B:
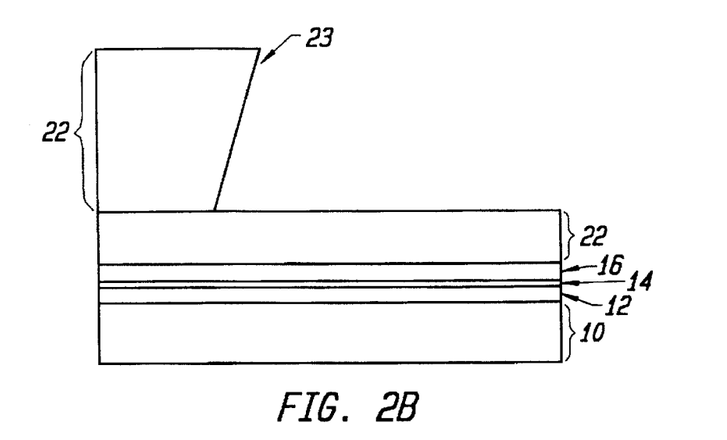

Turning to FIGS. 2A–2H the method will now be described in further detail with reference to its sequential steps. To form a gate electrode according to one embodiment of the invention a first photoresist layer 20 is formed over the surface of layer 16 as shown in FIG. 2A. A second photoresist layer 22 is formed on top of the first layer 20. The second layer 22 is selectively developed and processed to remove a portion of the second layer 22 and to form an edge 23 with a profile as shown in FIG. 2B. In the preferred embodiment the profile of second layer 22 is a retrograde profile. Also preferably the first photoresist layer 20 is treated by exposure to a fluorine containing plasma which forms a solvent barrier to prevent penetration by the second photoresist layer 22. This process is described more fully in "Plasma Formation of Buffer Layers for Multilayer Resist Structures" by Dobkin and Cantos, *IEEE Electron Device Letters*, Vol. EDL-2, No. 9, September 1981. Additionally, the retrograde profile may be achieved by an image reversal technique in U.S. Pat. No. 4,935,377 entitled "Method of Fabricating Microwave FET with Submicron Length," which is incorporated by reference herein.

Figure 2C:
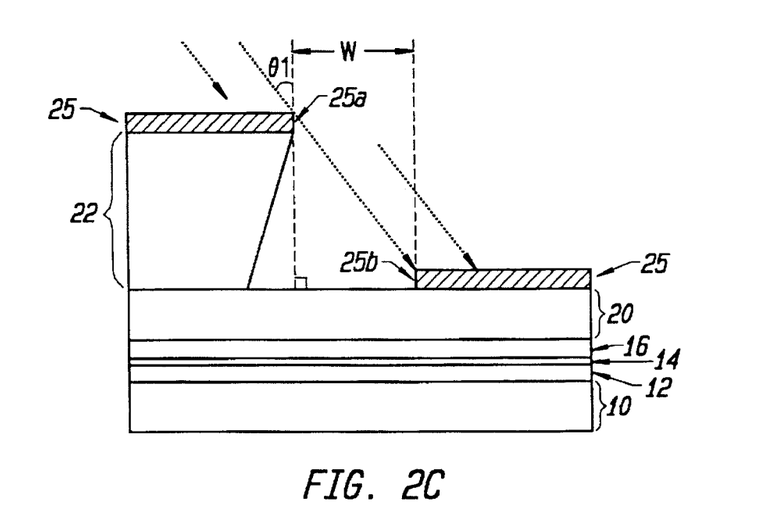

Next, a thin layer 25 of a first metal is evaporated over the first and second photoresist layers 20, 22 at a first angle $\theta_1$ incident to the wafer 5, where θ1 is in the range of $0° \leq \theta_1 \leq 90°$ as shown in FIG. 2C. During deposition, the edge 23 of the second photoresist layer 22 casts a "shadow" which prevents deposition of the metal on the first layer 20 adjacent to the base of the second layer 22 as illustrated in FIG. 2C. This creates a patterned metal mask 25 with edges 25a and 25b separated by an opening of width "w". The opening is defined by the thickness of the second photoresist layer 22 and the angle of inclination $\theta_1$. Preferably, the first metal is comprised of aluminum (Al).

Figure 2D:
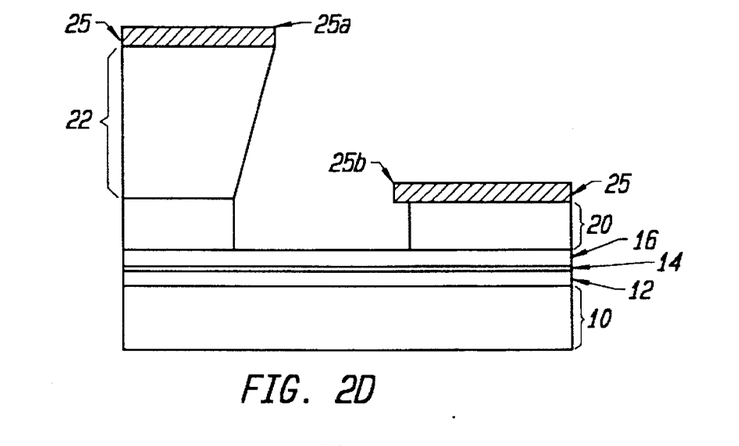
Figure 2E:
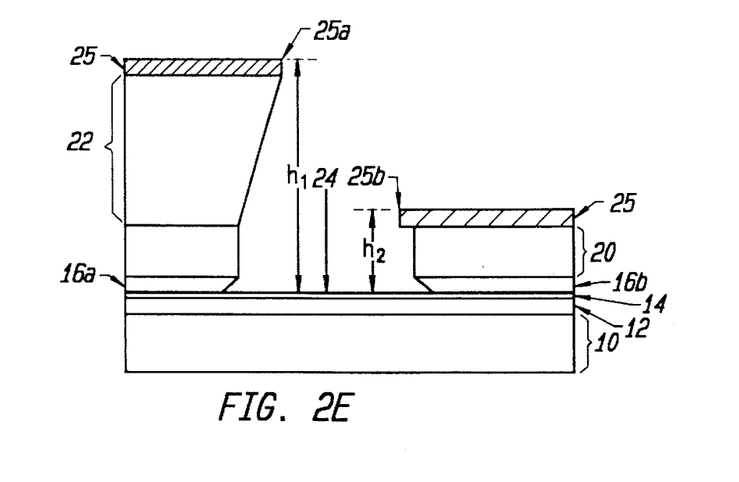

Thereafter, the exposed portion of the first photoresist layer 20 (which corresponds the patterned opening) is etched to exposed the GaAs layer 16 as illustrated in FIG. 2D. Preferably a low damage oxygen based anisotropic reactive ion etch (RIE) is used: The wafer 5 is then recessed etched which removes the masked portion of layer 16 to a well-controlled depth. In the preferred embodiment etching terminates upon reaching the etch stop layer 14, as shown in FIG. 2E. The etch stop layer 14 is preferably comprised of AlAs or $Al_xGa_{1-x}As$, where x represents the concentration of Al (mole fraction) and x may range from 0.2 to 1.0. Preferably a buffered aqueous solution comprising citric acid, a salt of citric acid and hydrogen peroxide is used which robustly terminates etching upon reaching the etch stop layer 14. The use of said citrate buffer as a highly selective etchant is fully taught in U.S. Pat. No. 5,374,328 entitled "Method of Fabricating Group III–V Compound Semiconductor Devices Using Selective Etching" which is incorporated by reference herein. Moreover, this etchant has the further advantage of preventing degradation of the Al mask. In an alternative embodiment, no etch stop layer is used. Termination is achieved by using a well controlled recess etching process.

The recessed etch exposes an underlying region of the active GaAs channel layer 12 and corresponds to the channel region 24 of the FET where the gate electrode will be formed.

Figure 2F:
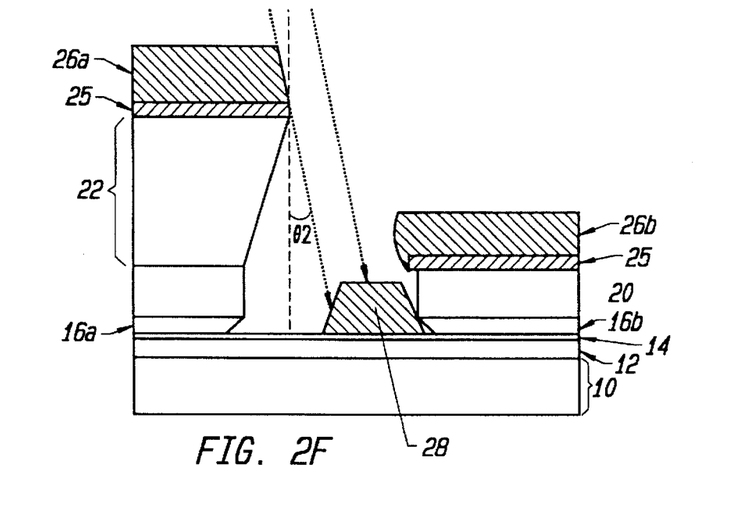

To begin placement of the gate electrode at the desired location in the channel region 24, a second material is deposited atop the wafer 5 at a second angle $\theta_2$ with respect to said wafer, where $\theta_2$ may be in the range of $-90° \leq \theta_2 \leq \theta_1$. Thus, two embodiments are possible, in one embodiment $\theta_2$ is a positive angle and in the alternative embodiment $\theta_2$ is a negative angle. The second metal forms a patterned layer 26a, 26b and forms a plug 28 in the channel region 24. In the embodiment where $\theta_2 \geq 0°$ placement of the plug edge 28a is determined by the height "$h_1$" and the second angle $\theta_2$ as shown in FIG. 2F. Height "$h_1$" represents the distance from the position of the first metal layer portion 25a to the bottom of the recessed area in the channel region 24. In the preferred embodiment the plug 28 is comprised of germanium (Ge) and exhibits a trapezoid shape with a plug height of 2500 angstroms. Plug 28 may be comprised of other suitable materials and shapes. The position of the plug 28 defines the footprint length of the gate electrode. Of particular advantage, the invention provides for highly controllable processing. In one instance the height "$h_1$" depicted in FIG. 2E determines the placement of the plug which defines one edge of the gate electrode footprint. The accuracy of height "$h_1$" is highly reproducible due in part to the stability of the selective etching process and due to the high control over the photoresist thickness.

Figure 2G:
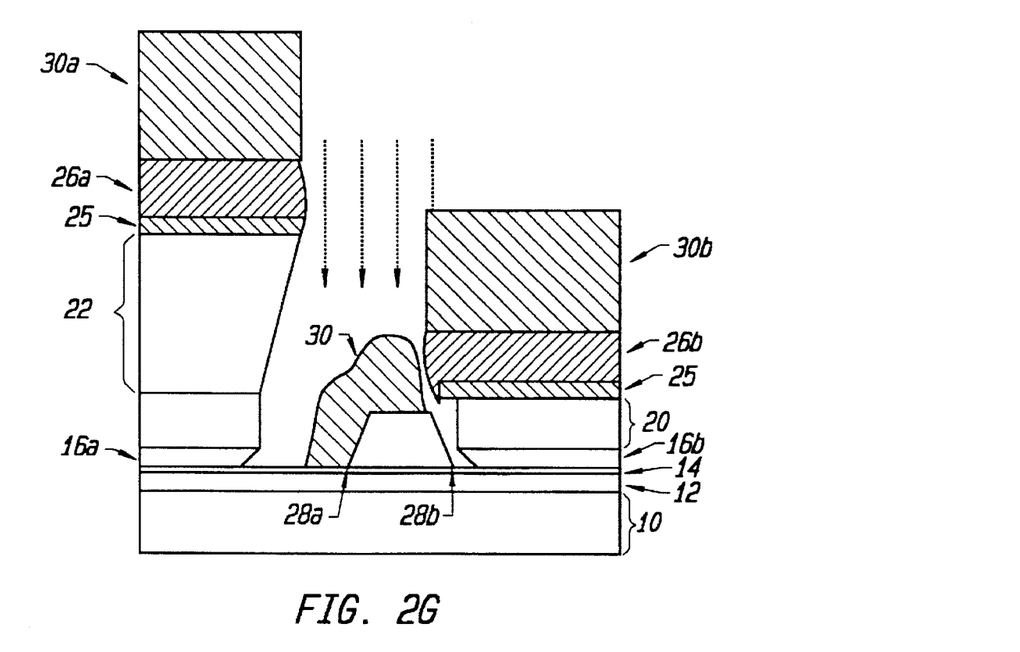

To form the gate electrode a gate metal is deposited at a perpendicular angle over the wafer 5 as shown in FIG. 2G. Any suitable gate metal may be used, or a combination of metals may be used if appropriate. In the channel region 24, the gate metal is deposited on top of the plug 28, which serves to shield a portion of the channel as depicted in FIG. 2G. A gate electrode 30 is formed having a gate length (Lg) defined by the distance between the edge 28a of the plug 28 and one side of the first metal mask 25a. Preferably, the gate electrode is of the gamma gate (or mushroom gate) type with a narrow gate stem 31, and a larger cap structure 32 forming the top portion of the gate. The gate length (Lg) is the length defined by the length of the intersection between the gate stem 31 and the surface of the channel region 24. The cap structure 32 is defined by the first metal layer (25a and 25b) patterned opening of width "w." Of particular advantage, this method enables reproducible formation of gate lengths as small as 0.15 microns, making the device suitable for many desired high frequency and wide microwave bandwidth applications.

Figure 2H:
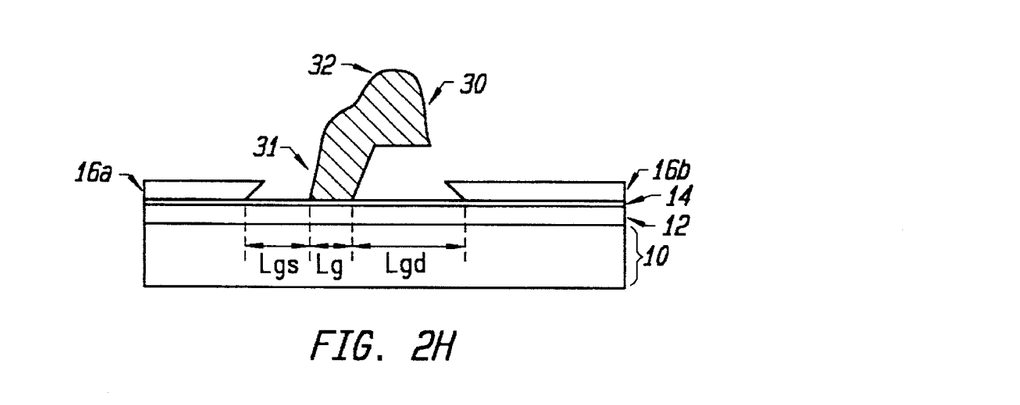

After formation of the gate electrode 30, the plug 28 is removed by etching. It is important that removal of the plug does not create surface contamination or damage, damage the newly formed gate electrode, nor damage the semiconductor material at or below the channel surface 24. The inventors have found that etching the plug 28 with a low-damage $CF_4$-oxygen plasma, while floating the wafer with reference to the plasma potential, offers the best technique. Thereafter the photoresist layers 20 and 22, and the Al mask 25, the second material layers 26a and 26b, and the excess gate metal 30a and 30b are removed with solvents using conventional lift-off techniques thus leaving the gate electrode 30 intact as shown in FIG. 2H.

The present invention produces highly reproducible gate lengths whereby certain key parameters have been successfully controlled. The width "w" of the patterned opening 25a and 25b in the first metal mask defines the width of the gate electrode cap 32. In the embodiment where $\theta_2 \geq 0°$ the lateral distance of the plug edge 28a to metal layer edge 25a determines the gate electrode length. Placement of the gate electrode within the active channel region 24 is determined by $h_1$ and $\theta_2$. These parameters are functions of the resist thickness and the angles of evaporation used in the deposition steps. In the preferred embodiment the thickness of the first and second photoresist layers 20 and 22 are 3500 angstroms and 8100 angstroms, respectively and the first and second angles of evaporation are 34° and 10°, respectively.

In the second embodiment where $\theta_2$ is a negative angle, i.e. $-90° \leq \theta_2 \leq 0°$, then placement of plug 28 and placement of the plug edge 28b is determined by the height "$h_2$" (shown in FIG. 2E) and the second angle $\theta_2$. Height "$h_2$" represents the distance from the position of the first metal layer portion 25b to the bottom of the recessed area in the channel region 24. The gate electrode length is defined by the lateral distance of the plug edge 28b to metal layer edge 25b. Placement of the gate electrode within the active channel region 24 is determined by $h_2$ and $\theta_2$.

Figure 3:
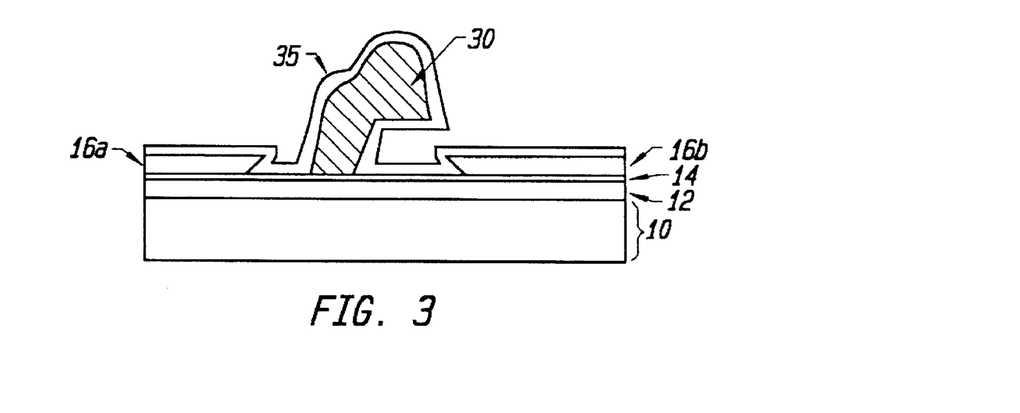
FIG. 3 is a cross-sectional view of a GaAs wafer containing a gate electrode fabricated according to an alternative embodiment of the invention.

In another embodiment of the present invention, a protective layer of dielectric material 35 may be formed atop the wafer after the gate electrode has been fabricated as shown in FIG. 3. Layer 35 coats all the free standing surfaces on the wafer 5. The shape of the gamma gate creates topology that is difficult to cover with a conformal layer. The present invention provides for a conformal layer of dielectric material formed by known plasma enhanced chemical vapor deposition (PECVD) techniques. Further it has been found that conformal coverage of the dielectric layer 35 is best achieved when the plug 28 height is equal to or greater than 2000 angstroms and the plug 28 undercut region is less than 0.5 microns. Preferably, layer 35 is comprised of silicon nitride.

Figure 4:
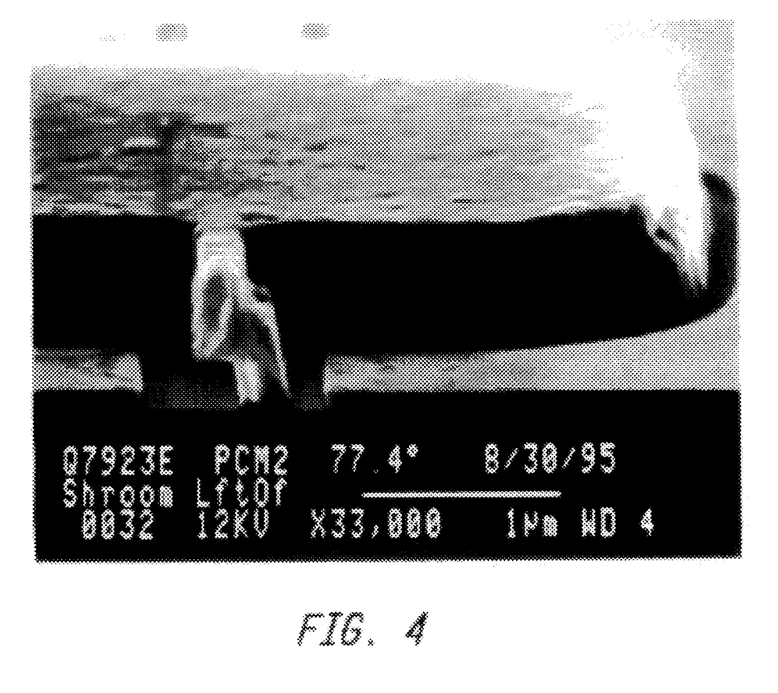
FIG. 4 is a SEM (scanning electron microscope) photograph illustrating a gate electrode with a gate feed attached fabricated according to the method of the invention.
Figure 5A:
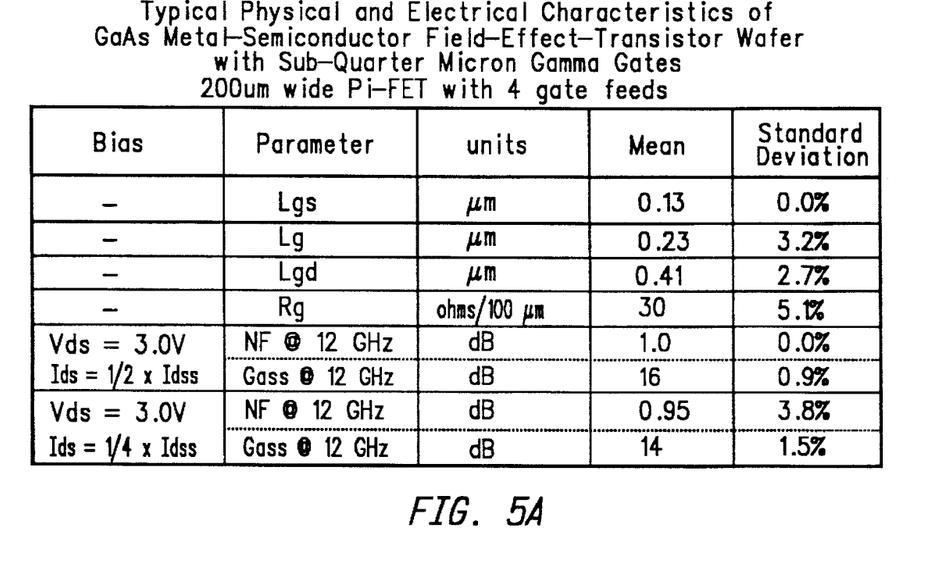
FIGS. 5a and 5b depict in tabular form the electrical characteristics, and definitions, respectively, exhibited by a GaAs FET fabricated according to the method of the present invention.
Figure 5B:
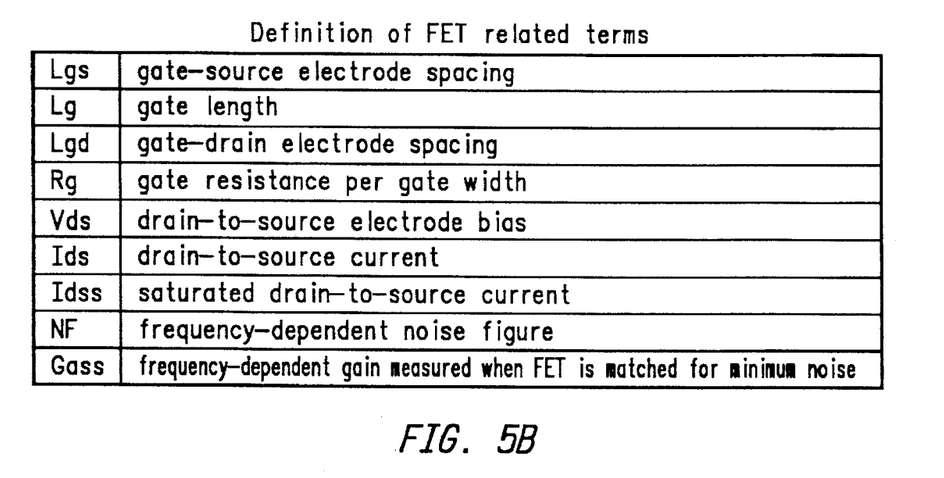
Figure 5C:
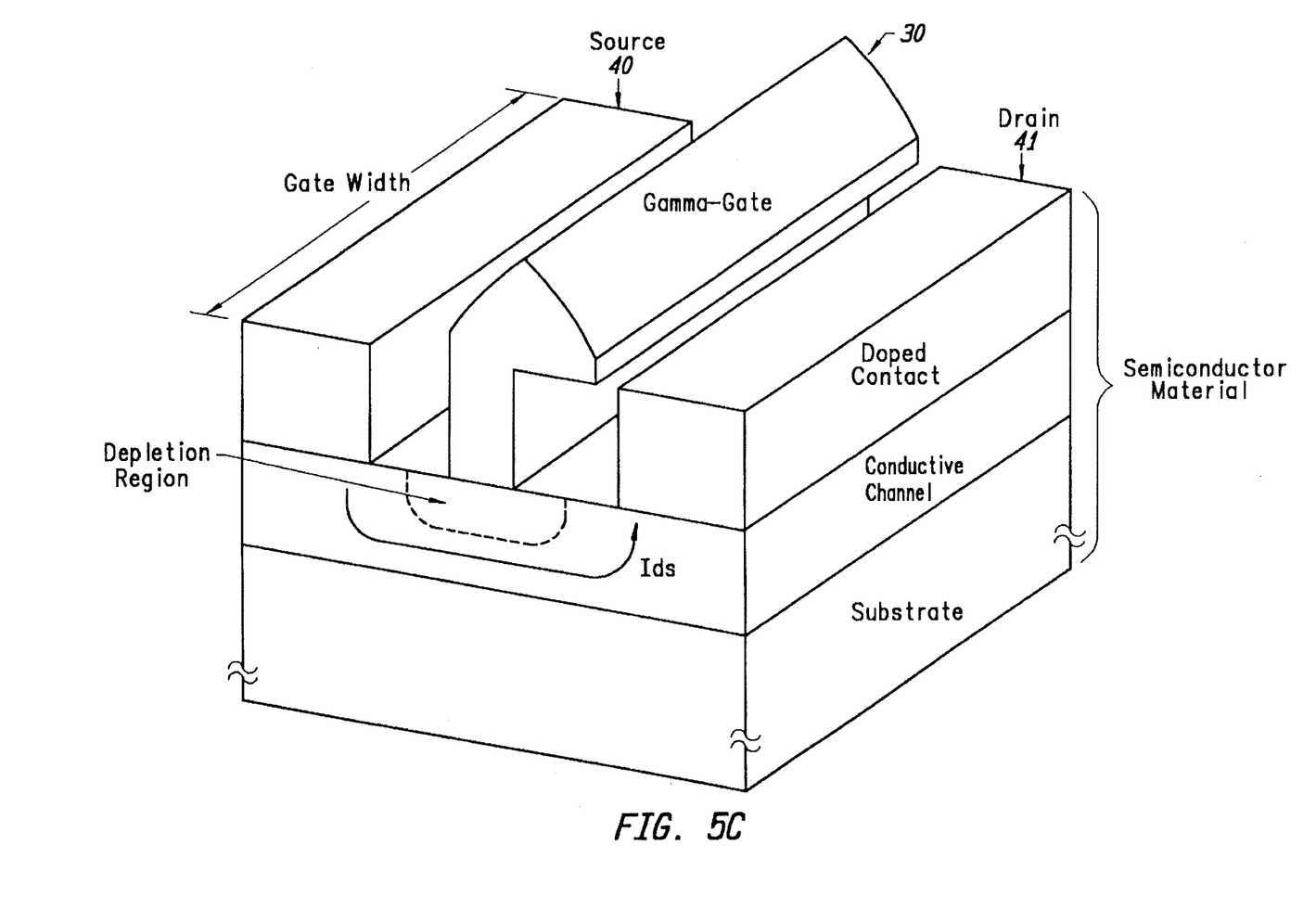
Figure 5D:
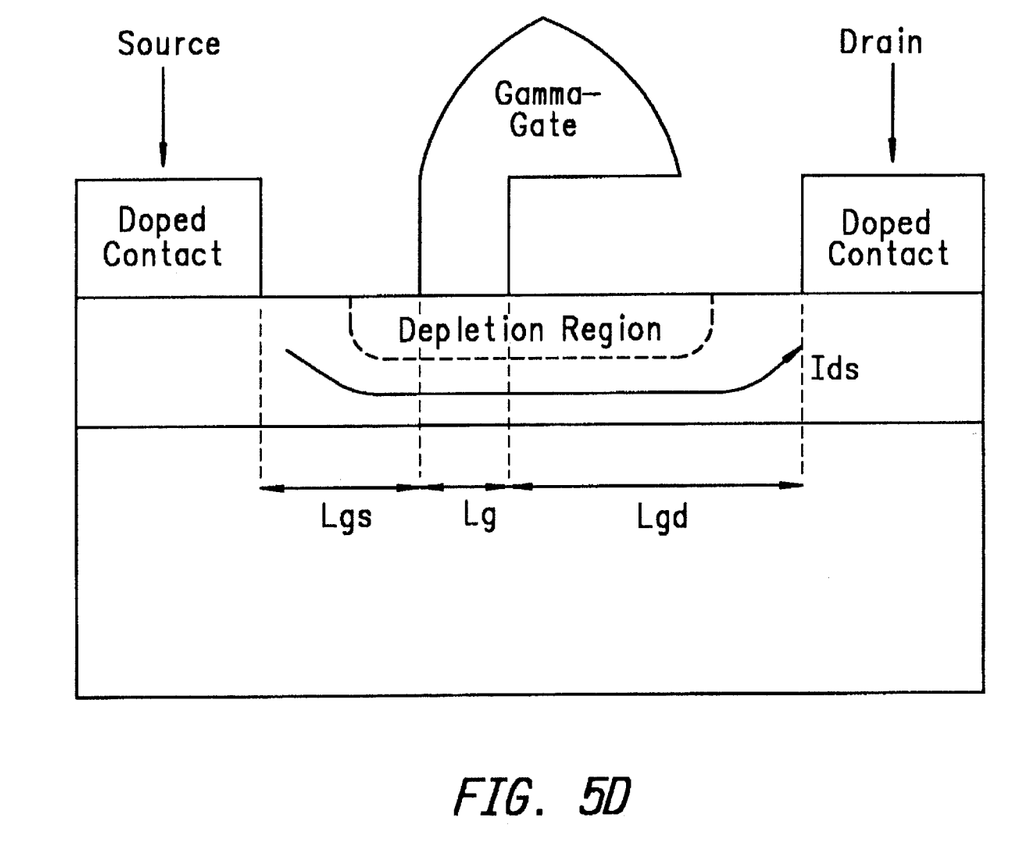

To illustrate the quality and structure of the gate electrode formed by the present invention attention is referred to FIG. 4, a scanning electron microscope (SEM) photograph of a cross section of a gamma gate electrode 30 attached to a gate feed 34 formed on a GaAs wafer. The gate electrode is comprised of titanium and aluminum with a cap width of 0.5 microns and a gate length of 0.2 microns. The electrical resistance of the gate was measured at 350–400 ohms/mm. The variation in the gate length across the wafer was measured to be less than ±100 Angstroms. Additional electrical performance characteristics of transistors from a GaAs FET wafer having sub micron gamma gate electrodes fabricated according to the invention are set forth in the Table of FIG. 5a. The electrical parameters are defined in FIG. 5b. FIGS. 5c and 5d represent two simplified views of a completed FET to illustrate certain of the parameters represented in FIG. 5a. FIG. 5c shows an elevated view of a typical FET with source and drain electrodes, 40 and 41. The Lgs represents the spacing between the gate 30 and source 40 electrodes, and Lgd represents the spacing between the gate 30 and drain 41 electrodes as shown in FIG. 5c. As discussed above, Lg represents the length of the gate electrode 30. The electrical parameters of the FET were measured by taking representative samples across the entire wafer. As shown in FIG. 5a the mean and standard deviations were measured. Most notably, the inventive method successfully produced sub quarter micron gate lengths (Lg) of 0.23 microns with excellent uniformity of 4.3 percent. Moreover, the inventive method has produced the same excellent uniformity for gate lengths of 0.18 microns.

Experimentation has shown that the resist thickness can be achieved to within ±5% accuracy, and the angle of evaporation is monitored to within ±0.5° accuracy, thus the gate electrode cap width and gate length, along with its position within the active channel region, are reproducible within approximately 6% accuracy. Accordingly, a cost effective, reproducible method for producing gate electrodes with uniform Lg as small as 0.15 microns across the length of the wafer has been achieved.

The foregoing description of specific embodiments of the invention have been presented for the purpose of illustration and description. They are not intended to be exhaustive or to limit the invention to the precise forms disclosed, and many modifications, embodiments, and variations are possible in light of the above teaching. It is intended that the scope of the invention be defined by the Claims appended hereto and their equivalents.

We claim:

1. A method of fabricating a Group III–V compound semiconductor wafer having a gate electrode comprising the steps of:

providing said wafer having a substrate and drain and source regions formed therein, and a active channel region;

forming a first and second photoresist layer atop said substrate;

selectively processing said second photoresist layer to form therein an edge with a reproducible profile thereby exposing a portion of said first photoresist layer;

depositing a first metal layer atop said first and second photoresist layers at a first angle with respect to said wafer normal whereby the edge of said second photoresist layer shields a portion of the first photoresist layer from metal deposition which defines a patterned opening of width "w";

first etching said wafer whereby the portion of said first photoresist layer not masked by said first metal layer is removed and exposes a portion of the underlying substrate;

second etching said substrate and terminating the etching at a desired location to expose said active channel region, and where a height "h" is defined by the distance from said first metal layer atop the second photoresist layer to said desired location;

depositing a second metal layer atop said wafer at a second angle with respect to said wafer normal, said second metal forming a plug in said channel region wherein the placement of one edge of said plug is determined by the height "h" and the second angle;

directly depositing at least one gate metal atop and normal to said wafer to form a gate electrode in said channel region, said gate electrode having a gate length defined by the distance between the edge of said plug and one side of the first metal mask, and a cap of width "w";

selectively removing said second metal layer and plug; and removing said first metal layer and said first and second photoresist layers.

2. The method of claim 1 wherein said first etching step comprises an ECR anisotropic plasma etch.

3. The method of claim 1 wherein said second etching step includes a etchant solution of citric acid, salt of citric acid and hydrogen peroxide.

4. The method of claim 1 wherein said second metal is Ge.

5. The method of claim 1 wherein said second photoresist layer is of greater thickness than said first photoresist layer.

6. The method of claim 1 wherein said profile is substantially a retrograde profile.

7. The method of claim 1 further comprising the step of depositing a layer of dielectric material atop said wafer and gate electrode to provide a protective covering.

8. The method of claim 1 wherein said gate electrode is a gamma gate electrode.

9. The method of claim 1 wherein said gate electrode has a gate length approximately equal to or less than 0.3 microns.

10. The method of claim 1 wherein said first angle ($\theta_1$) is approximately in the range of $0° \leq \theta_1 \leq 90°$.

11. The method of claim 1 wherein said second angle ($\theta_2$) is approximately in the range of $-90° \leq \theta_2 \leq \theta_1$.

12. A method of fabricating a Group III-V compound semiconductor wafer having a gamma gate electrode comprising the steps of:

providing said wafer having a GaAs substrate and drain and source regions formed therein, an etch stop layer; and an active channel region underlying said each stop layer;

forming a first and second photoresist layer atop said GaAs substrate;

selectively processing said second photoresist layer to form therein an edge with a reproducible profile thereby exposing a portion of said first photoresist layer;

depositing a first metal layer atop said first and second photoresist layers at a first angle with respect to said wafer whereby the edge of said second photoresist layer shields a portion of the first photoresist layer from metal deposition which defines a patterned opening of width "w";

first etching said wafer whereby the portion of said first photoresist layer not masked by said first metal layer is removed and exposes a portion of the underlying GaAs substrate;

second etching said GaAs substrate and terminating the etching upon reaching said etch stop layer to expose said active channel region, and where a height "h" is defined by the distance from said first metal layer atop the second photoresist layer to the etch stop layer;

depositing a second metal layer atop said wafer at a second angle with respect to said wafer, said second metal forming a plug in said channel region wherein the placement of one edge of said plug is determined by the height "h" and the second angle;

directly depositing at least one gate metal atop said wafer to form a gamma gate electrode in said channel region, said gamma gate having a gate length defined by the distance between the edge of said plug and one side of the first metal mask, and a cap of width "w";

selectively removing said second metal layer and plug;

removing said first metal layer and said first and second photoresist layers; and depositing a layer of dielectric material atop said wafer and gamma gate electrode to provide a protective covering.

13. The method of claim 12 wherein said first etching step comprises an ECR anisotropic plasma etch.

14. The method of claim 12 Wherein said second etching step includes a etchant solution of citric acid, salt of citric acid and hydrogen peroxide.

15. The method of claim 12 wherein said second metal is Ge.

16. The method of claim 12 wherein said etch stop layer is comprised of AlAs.

17. The method of claim 12 wherein said etch stop layer is comprised of AlxGa1-xAs, and where x is in the range of approximately 0.2 to 1.0.

18. The method of claim 12 wherein said gamma gate electrode has a gate length approximately equal to or less than 0.3 microns.

19. The method of claim 12 wherein said second photoresist layer is of greater thickness than said first photoresist layer.

20. The method of claim 12 wherein said profile is substantially a retrograde profile.

21. The method of claim 12 wherein said dielectric material is silicon nitride.

22. The method of claim 12 wherein said first angle ($\theta_1$) is approximately in the range of $0° \leq \theta_1 \leq 90°$.

23. The method of claim 12 wherein said second angle ($\theta_2$) is approximately in the range of $-90° \leq \theta_2 \leq \theta_1$.

* * * * *